March 12, 1968 K. S. TARNEJA ET AL 3,373,321

DOUBLE DIFFUSION SOLAR CELL FABRICATION

Filed Feb. 14, 1964

INVENTORS
KRISHAN S. TARNEJA
MOHAMMED S. SHAIKH
BY
C. L. Menzemer
ATTORNEY

United States Patent Office 3,373,321
Patented Mar. 12, 1968

3,373,321
DOUBLE DIFFUSION SOLAR CELL FABRICATION

Krishan S. Tarneja, Pittsburgh, Pa., and Mohammed S. Shaikh, Mountain View, Calif., assignors to Westinghouse Electric Corporation, Pittsburgh, Pa., a corporation of Pennsylvania Filed Feb. 14, 1964, Ser. No. 344,901
7 Claims. (Cl. 317—234)

This invention relates to solar cells and in particular concerns new semiconductive structures for use in solar cells and methods to produce functional zones, useful for solar cell applications, in semiconductive structures.

In one method presently known for producing solar cells, it is common to diffuse boron into n-type silicon to form a shallow p-n junction, the junction being formed by a single diffusion process. It can be shown by analysis that for optimum performance, a semiconductive material used for solar cell applications should be highly doped on either side of the junction therein. To attain that state in the simple procedure just mentioned would require the use of a low resistivity starting semiconductive material. There would result improved cell efficiency, but at the expense of degraded lifetime for the bulk of the semiconductor.

It is a primary object of the present invention to provide a novel method whereby semiconductive materials are provided in an easily practiced process without encountering the problem of degrading the lifetime of the bulk of the semiconductive material while securing low resistivity adjacent the junction therein.

It is another objective of the invention to provide slices of semiconductive material, such as single crystal or webbed dendritic silicon, in accordance with the foregoing object.

Other objects will be apparent from time to time in the following detailed description and discussion of the invention.

It has now been discovered, and it is on this discovery that the invention is on a large part predicated, that semiconductive materials with high lifetime bulk and low resistivity active areas can be readily provided whereby solar cells of good efficiency can be made. This unique result is achieved in accordance with present discoveries by a multiple diffusion application of conductivity determining materials to a bulk semiconductive material that is of comparatively high resistivity. More particularly in accordance with this invention, a slice or section of semiconductive material of high resistivity is subjected to a diffusion process in which a conductivity determining material of the conductivity type characterizing the bulk material is diffused into the surfaces thereof to a high concentration thereby resulting in low resistivity in the surface areas. Thereafter opposite conductivity type material is diffused into one of the surfaces to a high concentration to produce a zone of low resistivity opposite conductivity type material therein. In this simple manner, a p-n junction having highly doped regions on either side of the junction is formed while the bulk remains a high lifetime, high resistivity material. Accordingly, good cell efficiency is had without loss of lifetime in the bulk material. Furthermore, since both major surfaces of the diffused slice of semiconductive material are highly doped, the invention further provides that good ohmic contacts can be achieved.

In the practice of the invention, semiconductive materials such as a section of a dendrite or a slice of a single crystal or a webbed dendrite of either n- or p-type semiconductivity can be employed. In addition, although semiconductive silicon is the preferred semiconductive material others can be used as well, for example compound semiconductive materials such, for example, as gallium arsenide, indium phosphide or other Group III–V compounds. Suitable semiconductive materials generally are commercially available and the commercial materials can be used if desired. Particularly satisfactory material is webbed dendrite prepared, for example, in accordance with the teachings of the United States patent application of Dermatis and Faust, Jr., Ser. No. 98,618 filed Mar. 27, 1961, Patent No. 3,129,061, and assigned to the assignee of this application. Suitable single crystal silicon can be obtained by pulling a rod from a melt of silicon containing at least one element from Groups III and V of the Periodic Table, depending on the type conductivity desired. Slices can be cut therefrom using a diamond saw. Other conventional procedures are available in patents and the technical literature by which any semiconductive material desired can be prepared. However prepared, the semiconductive material used must be of high resistivity, by solar cell standards, for example it may be on the order of 5 to 50 ohm-cm. or higher.

The diffused regions in the slice or section of semiconductive material used can be produced by heating the semiconductive material in an atmosphere of the desired conductivity type impurity. For example, considering the semiconductive material to be silicon of p-type semiconductivity, a highly doped p-type layer is provided on the opposed major surfaces by placing the slice or section of silicon in a diffusion furnace having its hottest zone at a temperature within the range of about 600° to 1250° C. and having therein an atmosphere of an acceptor doping material, for example, indium, gallium, aluminum or boron. The surfaces of the semiconductor may first be cleaned and etched if desired. The acceptor material can be contained in a crucible or boat in the furnace, the boat being heated to a temperature to insure the desired vapor pressure and surface concentration of diffusant. Since a very low resistivity zone is desired, e.g. less than about $10^{-1}$ ohm-cm., a high concentration of diffusant is used. For the usual acceptor materials, the diffusant temperature is in the range of about 250° to 750° C. or higher, but of course at a temperature below that of the silicon or other semiconductive material employed. The acceptor can also be provided in gaseous form and supplied to the diffusion chamber in a carrier gas, in which case different temperature zones in the furnace may be unnecessary. The acceptor impurity diffuses into the major surfaces of the slice of silicon to the desired depth, for example 0.2 to 2 mils. Undesired layers on the sides of the silicon slice may be removed by lapping, etching or other conventional techniques. It may be noted that the first diffused zone must receive the second diffused zone, discussed hereinafter, and accordingly its size or depth is chosen with that in mind.

The junction is then produced within one of the resulting highly doped surfaces by a second diffusion process. Continuing with the assumption (adopted solely for ease of discussion) of p-type bulk with a $p^+$ layer thereon, a suitable donor impurity, for example, antimony phosphorus, or the like is diffused therein. This is effected in the same general manner as just described for the diffusion of p-type materials, with appropriate adjustment for the different materials involved. Diffusion of the n-type material is needed on but one of the major surfaces. Accordingly, it may be desirable to diffuse while the other surfaces are masked as by oxidizing those surfaces to silicon dioxide, which can later be removed by, for example, hydrofluoric acid etching or other chemical procedure, to expose the underlying material. Alternatively, no masking need be accomplished, and undesired layers can be removed after diffusion. In either event the structure is placed in a diffusion furnace wherein an atmosphere of the desired donor impurity is present and diffusion is carried out as before. For phosphorus diffusion, $P_2O_5$ or other phosphorus source is maintained therein at about 250° to 750° C. while the semiconductive material is at a temperature of about 600° to 1250° C. A low resistivity (e.g. about $10^{-3}$ ohm-cm.) region of up to about one or more microns thick is produced, thereby resulting in a p-n junction having low resistivities on each side thereof. The period in which diffusion is practiced for each of the diffusion steps is determined by such considerations as the specific materials involved, the particular diffusants and their diffusion constants, temperatures to be used, depth desired and the like, as is well known in the art. In general, however, diffusion is practiced in this invention for about 5 minutes to 5 hours or more, though other periods could as well be used.

Of course the conductivity types may be reversed from that just described and other conditions of diffusion used in practicing the invention.

The invention will be further described in conjunction with the attached drawing, in which.

Figure 1:
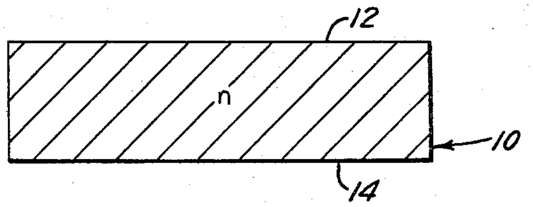
FIG. 1 is a side view of a slice of semiconductive material with which the present invention can be practiced.
Figure 2:
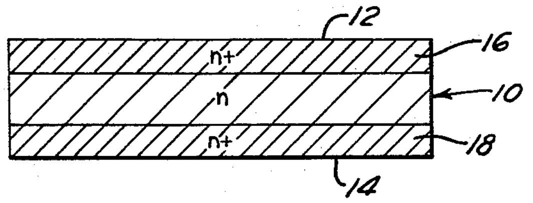
FIG. 2 is a side view of the semiconductive material at a further stage of process.
Figure 3:
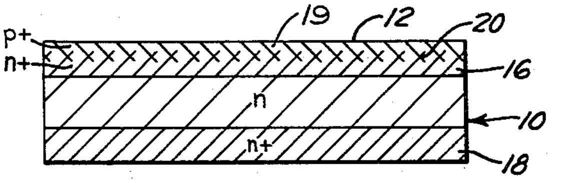
FIG. 3 is a side view of the wafer of FIG. 2 after a stage of processing in which a junction has been produced.
Figure 4:
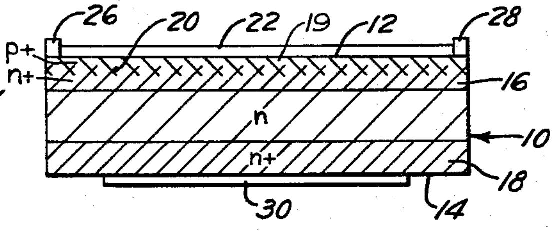
FIG. 4 is a side view of the wafer of FIG. 3 showing contacts thereto.

Referring now to the figures as a group, there is shown a slice 10 of single crystal silicon that may, for purposes of illustration, be considered of n-type semiconductivity. Of course, p-type semiconductivity material could also be used and as already noted, other semiconductive materials could also be employed. For example, the slice 10 may be a section of a webbed dendrite rather than of a single crystal or the like. Suitably, the silicon has a resistivity on the order of about 5–50 ohm-cm., though higher or lower resistivity material could be used if desired. The slice 10 is relatively thin, and may be, for example, 5 to 30 mils thick. The opposed major surfaces 12 and 14 can have dimensions of about 1 x 2 cm., though larger or smaller sizes could also be used. Actually, larger sizes are preferable because fewer of the resulting cells would then be needed for a given application.

The first step in producing a material suitable for solar cell application in accordance with this invention is to diffuse into the major surfaces 12 and 14 of the slice 10 of n-type single crystal silicon a high concentration of n-type conductivity material, for example, nitrogen, phosphorus, arsenic, or antimony. This can be accomplished by placing the crystal, after suitable cleaning, etching and like procedures have been applied, in a furnace in which there is an atmosphere of the n-type conductivity material. The furnace chosen must withstand the temperature and pressure conditions attained during diffusion and suitably does not introduce undesired impurities. A quartz tube has been found to be satisfactory. Conditions suitable to diffusion of the n-type conductivity material into the surfaces of the slice 10 of semiconductive silicon are maintained for a period sufficient to form a shallow $n^+$ region, for example about 0.1 to 2.0 mils thick, and preferably within the range of about 0.5 to 1 mil thick. Diffusion in these circumstances will cover all surfaces of the slice, and undesired layers can be removed as by lapping or etching procedures. There results low resistivity layers 16 and 18 in the slice 10.

The structure is next subjected to an atmosphere of opposite conductivity type material, which would be p-type material in view of the n-type semiconductivity assumed for the starting material. Boron, aluminum, gallium or indium can be used as the acceptor, with boron being particularly satisfactory. The diffusion of the p-type material is continued until a very shallow $p^+$ region 19 is developed therein, that is of low resistivity. This region may be from about 2,000 to 15,000 angstroms deep, thereby resulting in a p-n junction 20 at a depth of about 0.2 to 1.5 micron in the slice 10 of semiconductive material. If the opposite surface and the sides were not masked, the resulting p-type layers would now be removed.

Figure 5:
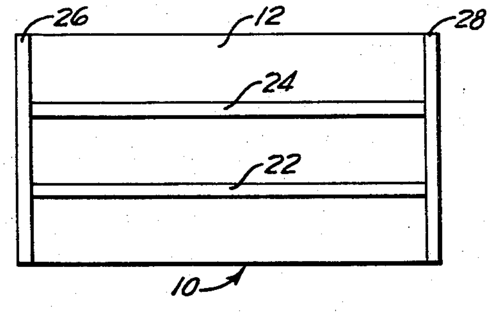
FIG. 5 is a top view of the wafer of FIG. 4.

Contacts are then applied. Metal strips 22 and 24 (FIG. 5) can be alloyed to the p-type surface along with bus bars 26 and 28 at the edges thereof, while a large area metal contact 30 is provided on the n-side. For the p-side, aluminum strips and bus bare, or other metal containing a p-type impurity are used, while an n-type metal such as 0.1 to 0.5 weight percent antimony-gold alloy can be used to form contact 30. These contacts can be applied to the structures by any other technique desired. For example, electroless plating can be used in which single strip contacts can be applied by conventional photo-resist techniques. Copper plating can be used similarly, with masking being used when strip or bar contacts are desired.

The resulting structure is then used in the conventional manner for solar cell applications.

The invention will be described further in conjunction with the following specific example in which the details are given by way of illustration and not by way of limitation.

A slice of n-type Czochralski grown single crystalline silicon having a resistivity of 20 ohm-cm. and being 20 mils thick and with major faces of 1 x 2 cm. is used. After etching, washing and drying, the slice is placed in the high temperature zone of a two zone furnace. The silicon is heated, with suitable controllers set at 950° C., while the other zone is heated to 290° C. The slice of silicon is supported within the furnace on a flat quartz boat. After flushing the atmosphere in the furnace, 1 to 3 grams of $P_2O_5$ are placed in a quartz boat which is then advanced into the 290° C. zone. Oxygen is used as the atmosphere and is fed to the unit at a rate of about 15 cc. per minute. This condition is maintained for about 20 minutes. Thereupon the $P_2O_5$ containing boat is removed and the flow of oxygen increased to 30 cc. per minute to drive out any $P_2O_5$ in the atmosphere. The oxygen flow is then stopped and the furnace is allowed to cool. At these conditions a high concentration of phosphorus ($10^{21}$ atoms or more per cc.) diffuses to a depth of about one mil in all surfaces of the silicon slice.

The surfaces of the resulting phosphorus diffused slice of silicon are then again cleaned, as by etching, washing and drying. It is placed on a clean dry boat, and advanced into a furnace containing an atmosphere of nitrogen or other inert gas. Power to the furnace is then turned on and is set for about 850° C. During this time, nitrogen flows through the furnace at a rate of about 2 liters per minute. When the furnace temperature is achieved, boron trichloride is admitted thereto at a rate of about 50 cc. per minute for about 8 minutes. At the end of 8 minutes the boron trichloride flow is terminated but nitrogen flow is continued and the furnace temperature is raised to about 1150° C. After one-half hour, the furnace is cooled to about 500° C. There results a boron doped layer on the surfaces of the silicon to a depth of about one micron, the layer having a boron concentration on the order of $10^{21}$ atoms per cc. It is to be noted that at these conditions, nitrogen does not react and therefore does not constitute a dopant. The bottom layer is machine lapped sufficiently to remove the boron layer, while the sides are lapped enough to expose the bulk.

Contacts are provided to the resulting doubled diffused slice of semiconductive silicon as follows: The surfaces are etched for about 2 minutes in 40 percent hydrofluoric acid. After being washed in deionized water, the slices are cleaned, for example by ultrasonic treatment in a liquid which may be acetone and water. Two contacts, one millimeter wide each, are applied across the p-surface, and a bus bar 3 mm. wide is applied along an edge of the same surface and in contact with the two contacts. This is accomplished by the photo-resist technique, in which a photo-resist coating is first applied by brushing and a film containing the contact image is placed thereon and then is exposed to ultraviolet light. After developing, the sample is rinsed with thinner and then alcohol. Aluminum is then evaporated to the surface by heating aluminum to about 500° C. in a furnace containing the sample. An alloy of one percent antimony in gold is alloyed to the n-side to provide the ohmic contact thereto.

The resulting semiconductive device is thus characterized by a p-n junction having low resistivity on each side of it and a bulk of high resistivity and therefore high lifetime.

Webbed dendrites produced in accordance with the application of Dermatis et al. hereinbefore identified can be obtained in large sizes of many inches in length. Such webbed dendrites can be used to prepare solar cells in accordance with this invention by the procedures just described. In addition to the advantages noted, webbed dendrite solar cells are further advantageous because assemblies thereof can be made with fewer connections and therefore even greater reliability.

From the foregoing discussion and description it is evident that the present invention comprises a uniquely simple manner by which semiconductive structures having good efficiencies (i.e. 8 to 15 percent) in solar cell applications without sacrifice in other desired properties are provided. While the invention has been described with respect to particular materials and other details, it should be evident that changes, substitutions and the like can be made without departing from its scope.

We claim:

1. A semiconductor structure for use in solar cells comprising a body of semiconductive material of a first semiconductivity type and a high resistivity and having opposed major surfaces, a thin zone of the first semiconductivity type and of a low resistivity material in each of the major surfaces thereof, a zone thinner than said first zone of the first semiconductivity type, of opposite semiconductivity type and of low resistivity in surface of one of the thin zones of first semiconductivity type whereby a p-n junction is provided, a grid type ohmic contact on a portion of the surface of the thin zone of opposite semiconductivity type and a large area ohmic contact on the surface of the first conductivity type surface.

2. A structure in accordance with claim 1 in which said body of semiconductive material is a semiconductive Group III–V compound.

3. A structure in accordance with claim 1 in which said body of semiconductive material is the web portion of a webbed dendrite.

4. A semiconductive structure for use in solar cells comprising a body of a first semiconductivity type semiconductive silicon having a high resistivity and opposed major surfaces, a thin zone of the first semiconductivity type in each of the opposed major surfaces of the semiconductive silicon, the zones having a low resistivity, a zone of opposite semiconductivity type material in the surface of one of the thin zones of first semiconductivity type to provide a junction therein characterized by low resistivity on each side of the junction, an ohmic contact to a portion of the opposite semiconductivity type zone, and a large area ohmic contact to the other major surface of the semiconductive silicon.

5. A structure in accordance with claim 4 in which said shape of semiconductive silicon is the web portion of a webbed dendrite.

6. A semiconductive structure for use in solar cells comprising a body of n-type semiconductive silicon having a high resistivity and opposed major surfaces, a thin phosphorus doped zone in each of the opposed major surfaces of the body of semiconductive silicon, the phosphorus doped zones each having a low resistivity, a boron doped zone in the surface of one of the phosphorus doped zones to provide a junction therein characterized by low resistivity on each side of the junction, a grid ohmic contact to a portion of the boron doped zone, and a large area ohmic contact to the exposed phosphorus dope zone on the opposite surface of the body of semiconductive silicon.

7. A semiconductive structure for use in solar cells comprising a body of n-type semiconductive silicon havin a resistivity of about 5 to 50 ohm-cm. and opposed major surfaces, a phosphorus doped zone up to about 2 mils in thickness in each of the opposed major surfaces of the body of semiconductive silicon, the phosphorus doped zones having a low resistivity of below about $10^{-1}$ ohm-cm., a boron doped zone in the surface of one of the phosphorus doped zones to provide a junction therein characterized by low resistivity on each side of the junction, the boron doped zone being up to about 2 microns in thickness, an ohmic contact to a portion of the boron doped zone, and a large area ohmic contact to the other major surface of the slice of semiconductive silicon.

References Cited

UNITED STATES PATENTS

| | | | |
|---|---|---|---|
| 3,050,864 | 8/1962 | Sclar | 325—105 |
| 3,079,512 | 2/1963 | Rutz | 307—88.5 |
| 3,105,177 | 9/1963 | Aigrain | 317—234 |
| 3,126,483 | 3/1964 | Hoalst | 250—83.3 |
| 3,187,193 | 6/1965 | Kappaport | 307—88.5 |
| 3,254,234 | 5/1966 | Sziklai et al. | 307—88.5 |
| 3,265,532 | 9/1966 | Mooser | 117—217 |

OTHER REFERENCES

R.C.A. Technical Notes #536, March 1962.

JOHN W. HUCKERT, *Primary Examiner.*

M. EDLOW, *Assistant Examiner.*